US012719420B2

(12) United States Patent
Nasu

(10) Patent No.: US 12,719,420 B2
(45) Date of Patent: Aug. 25, 2026

(54) POWER AMPLIFIER

(71) Applicant: Murata Manufacturing Co., Ltd., Kyoto (JP)

(72) Inventor: Koji Nasu, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 380 days.

(21) Appl. No.: 18/591,611

(22) Filed: Feb. 29, 2024

(65) Prior Publication Data

US 2024/0204736 A1 Jun. 20, 2024

Related U.S. Application Data

(63) Continuation of application No. PCT/JP2022/030310, filed on Aug. 8, 2022.

(30) Foreign Application Priority Data

Sep. 3, 2021 (JP) ................................ 2021-144237

(51) Int. Cl.
*H03F 3/21* (2006.01)

(52) U.S. Cl.
CPC ..................................... *H03F 3/21* (2013.01)

(58) Field of Classification Search
CPC ....... H03F 3/20–2178; H03F 2200/451; H03F 1/0205; H03F 3/45179; H03F 3/193; H03F 3/245; H03F 3/195; H03F 1/30; H03F 3/45475; H03F 3/45183; H03F 1/0261; H03F 1/301; H03F 1/0272; H03F 1/32; H03F 3/19; H03F 3/24; H03F 1/26;
(Continued)

(56) References Cited

U.S. PATENT DOCUMENTS

2001/0015668 A1 8/2001 Sakamoto et al.
2003/0137355 A1* 7/2003 Lin ........................ H03F 1/301 330/290

(Continued)

FOREIGN PATENT DOCUMENTS

JP 2001-237655 A 8/2001
JP 2003-008358 A 1/2003
JP 2004-193846 A 7/2004

OTHER PUBLICATIONS

International Search Report for PCT/JP2022/030310 dated Nov. 8, 2022.

*Primary Examiner* — John W Poos
(74) *Attorney, Agent, or Firm* — McDonald Hopkins LLC

(57) ABSTRACT

A power amplifier includes a first transistor and a bias circuit, in which the bias circuit includes a first bias detection circuit, an error amplifier circuit, a bias output buffer circuit, and a second bias detection circuit, the error amplifier circuit includes a comparator, the bias output buffer circuit includes a second transistor, a first node, and a second node, the first bias detection circuit is connected between a drain of the first transistor and the comparator, the second transistor is connected between the comparator and the first node, the first node is connected between the second transistor and the second node and between the transistor and the second bias detection circuit, the second node is connected between the first node and a gate of the first transistor, and the second bias detection circuit is connected between the first node and the second node.

16 Claims, 4 Drawing Sheets

(58) Field of Classification Search
CPC .......... H03F 2200/18; H03F 1/52; H03F 1/02; H03F 1/302; H03F 1/223; H03F 1/0266; H03F 2200/294; H03F 1/3205; H03F 3/72; H03F 2200/78; H03F 2200/453; H03F 1/523; H03F 3/217; H03F 1/342; H03F 1/0222; H03F 1/0211
USPC .................................................. 330/290–294
See application file for complete search history.

(56) References Cited

U.S. PATENT DOCUMENTS

2004/0108902 A1 6/2004 Akamine et al.
2010/0156539 A1* 6/2010 Ha ........................ H03F 1/0261 330/285
2011/0298538 A1* 12/2011 Andrys ................... H03F 3/189 330/127
2014/0152390 A1* 6/2014 McMorrow ........... H03F 1/0277 330/296
2014/0152391 A1* 6/2014 Sowlati ................... H03F 3/195 330/296
2015/0015339 A1* 1/2015 Gorbachov .......... H03G 3/3042 330/291
2019/0058448 A1* 2/2019 Seebacher ............. H04B 1/401

* cited by examiner 2
20a
30a
R11
40
R2
A2
42
41
50
51
52
53
N1
54
N2
A1
61
60
t3
L1
L2
C1
C2
t1
t2
10
100

POWER AMPLIFIER

CROSS REFERENCE TO RELATED APPLICATION

This is a continuation of International Application No. PCT/JP2022/030310 filed on Aug. 8, 2022 which claims priority from Japanese Patent Application No. 2021-144237 filed on Sep. 3, 2021. The contents of these applications are incorporated herein by reference in their entireties.

BACKGROUND OF THE DISCLOSURE

Field of the Disclosure

The present disclosure relates to a power amplifier.

Description of the Related Art

Patent Document 1 discloses a technique by which performance of the power amplifier is stabilized by detecting a drain current of a power amplification transistor and performing feedback so that the drain current becomes a target current value.

Patent Document 1: Japanese Unexamined Patent Application Publication No. 2004-193846

BRIEF SUMMARY OF THE DISCLOSURE

However, with the technique disclosed in Patent Document 1, a frequency band (loop band) in which the output impedance of a bias circuit that performs feedback can be maintained in a low state is narrow, and the performance of the bias circuit may be insufficient as a bias circuit of a power amplifier that handles a recent wideband modulation signal. On the other hand, when it is attempted to realize a wider loop band (in other words, a higher feedback speed), the loop gain of the bias circuit decreases because the GB product (Gain Band width product), which is a characteristic of the power amplifier, is constant, and thus the precision of the power amplifier is reduced. Thus, it is difficult to achieve both a wider band and higher precision of the bias circuit.

Therefore, a possible benefit of the present disclosure is to provide a power amplifier that can easily achieve both a wider band and higher precision of a bias circuit.

A power amplifier according to an aspect of the present disclosure includes: a first power amplification transistor and a bias circuit, in which the bias circuit includes a first bias detection circuit, an error amplifier circuit, a bias output buffer circuit, and a second bias detection circuit, the first power amplification transistor has a first output terminal and a first control terminal, the error amplifier circuit includes a comparator, the bias output buffer circuit includes a first p-type transistor, a first node, and a second node, the first bias detection circuit is connected between the first output terminal and the comparator, the first p-type transistor is connected between the comparator and the first node, the first node is connected between the first p-type transistor and the second node and between the first p-type transistor and the second bias detection circuit, the second node is connected between the first node and the first control terminal, and the second bias detection circuit is connected between the first node and the second node.

According to the present disclosure, a power amplifier that can easily achieve both a wider band and higher precision of a bias circuit can be realized.

DETAILED DESCRIPTION OF THE DISCLOSURE

Figure 1:
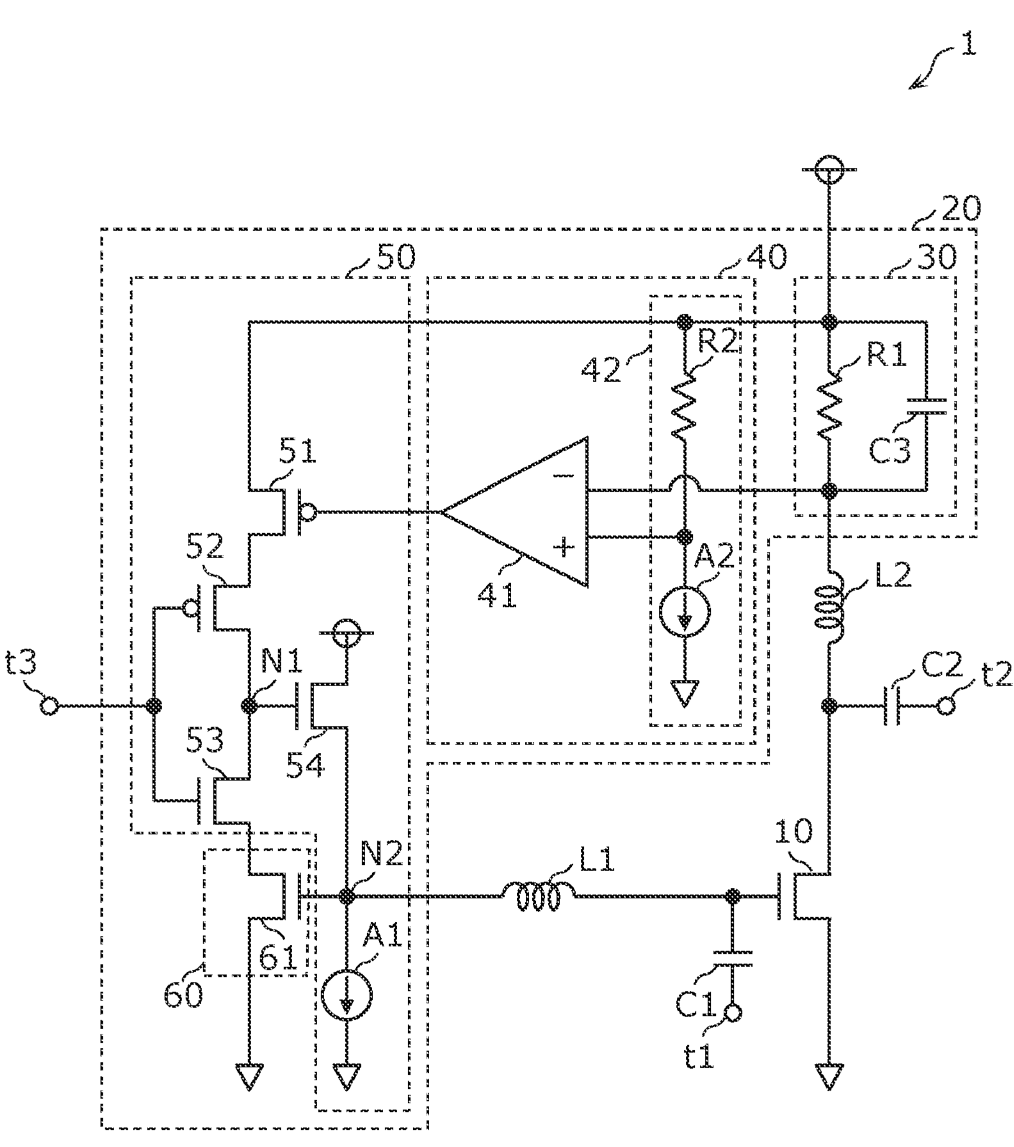
FIG. 1 is a circuit configuration diagram illustrating an example of a power amplifier according to Embodiment 1.

Hereinafter, embodiments of the present disclosure will be described in detail with reference to the drawings. Note that the embodiments described below are all comprehensive or specific examples. The numerical values, shapes, materials, constituent elements, the arrangement and connection form of the constituent elements, and the like shown in the following embodiments are mere examples, and are not intended to limit the present disclosure. Among the constituent elements in the following embodiments, constituent elements not recited in any one of the independent claims are described as optional constituent elements. In addition, the size of components or the size ratio of components shown in the drawings is not necessarily precise. In addition, in the drawings, substantially the same components are denoted by the same reference numerals, and redundant description may be omitted or simplified. In addition, in the following embodiments, the term “being connected” includes not only the case of being directly connected but also the case of being electrically connected via another element (for example, a capacitor, an inductor, or a semiconductor element such as a diode or a transistor). For example, “being connected between A and B” means that it is connected between A and B, either directly or via another element, to both A and B.

Embodiment 1

Embodiment 1 will be described with reference to FIG. 1 to FIG. 3.

FIG. 1 is a circuit configuration diagram illustrating an example of a power amplifier 1 according to Embodiment 1.

The power amplifier 1 is a circuit that amplifies and outputs an input high-frequency signal, and is, for example, a power amplifier (PA). The power amplifier 1 includes an input terminal t1 and an output terminal t2. The input terminal t1 is a terminal to which a high-frequency signal is inputted, and the output terminal t2 is a terminal from which an amplified high-frequency signal is outputted.

The power amplifier 1 includes a transistor 10 and a bias circuit 20. In addition, the power amplifier 1 includes capacitors C1 and C2 and inductors L1 and L2. The capacitor C1 is a capacitor that prevents a direct current from leaking from the input terminal t1 to the transistor 10. The capacitor C2 is a capacitor that prevents a direct current from the power supply from leaking to the output terminal t2. The inductor L1 is an inductor that prevents a high-frequency signal from the input terminal t1 from leaking to the bias circuit 20. The inductor L2 is an inductor that prevents a high-frequency signal to the output terminal t2 from leaking to the bias circuit 20.

The transistor 10 is an example of a first power amplification transistor. The transistor 10 has a first output terminal and a first control terminal. The first control terminal is a gate or a base, and the first output terminal is a drain or a collector. In addition, the transistor 10 has a source or emitter connected to an earth terminal (ground). For example, the transistor 10 is an N-channel type field effect transistor (FET), and in this case, the first control terminal is a gate, the first output terminal is a drain, and a source is connected to the earth terminal.

The gate of the transistor 10 is connected to the input terminal t1 via the capacitor C1, and is connected to the bias circuit 20 (to be specific, a node N2 described later) via the inductor L1. The drain of the transistor 10 is connected to the output terminal t2 via the capacitor C2, and is connected to the bias circuit 20 (to be specific, a bias detection circuit 30 described later) via the inductor L2.

The bias circuit 20 is a circuit that detects a drain current and a gate voltage of the transistor 10 and applies the gate voltage to the transistor 10 so as to suppress fluctuations in the gate voltage and fluctuations in the drain current. The bias circuit 20 includes the bias detection circuit 30, an error amplifier circuit 40, a bias output buffer circuit 50, and a bias detection circuit 60.

The error amplifier circuit 40 includes a comparator 41 and a reference value generation circuit 42. The comparator 41 includes, for example, a positive-side input terminal, a negative-side input terminal, and an output terminal, and outputs a signal corresponding to a difference between a voltage value applied to the positive-side input terminal and a voltage value applied to the negative-side input terminal from the output terminal. The reference value generation circuit 42 is a circuit that generates a reference value, which is a voltage value applied to the positive-side input terminal of the comparator 41, and includes, for example, a resistor R2 and a current source A2. One end of the resistor R2 is connected to the power supply, and the other end of the resistor R2 is connected to one end of the current source A2 and the positive-side input terminal of the comparator 41. One end of the current source A2 is connected to the other end of the resistor R2 and the positive-side input terminal of the comparator 41, and the other end of the current source A2 is connected to the earth terminal. By appropriately setting the current value to be supplied by the current source A2 and the resistance value of the resistor R2, the reference value to be applied to the positive-side input terminal of the comparator 41 can be generated. Further, the current source A2 is used for generating the reference value, and thus it is possible to generate a stable reference value.

The bias detection circuit 30 is an example of a first bias detection circuit. The bias detection circuit 30 detects the drain current of the transistor 10. The bias detection circuit 30 is connected between the drain of the transistor 10 and the comparator 41. Specifically, the bias detection circuit 30 is connected between the drain of the transistor 10 and the negative-side input terminal of the comparator 41. The bias detection circuit 30 includes a resistor R1 which is a resistor element, and a capacitor C3. One end of the resistor R1 is connected to one end of the capacitor C3, the other end of the resistor R1 is connected to the other end of the capacitor C3, and the resistor R1 and the capacitor C3 are connected in parallel. The capacitor C3 is a capacitor for stabilizing the operation of the power amplifier 1. Note that the bias detection circuit 30 need not include the capacitor C3. One end of the resistor R1 is connected to the power supply, and the other end of the resistor R1 is connected to the drain of the transistor 10 via the inductor L2. In addition, the other end of the resistor R1 is connected to the negative-side input terminal of the comparator 41.

The drain current of the transistor 10 is converted into a voltage at the other end of the resistor R1 by the bias detection circuit 30, and the voltage is applied to the negative-side input terminal of the comparator 41. The comparator 41 outputs a signal corresponding to a difference between the reference value generated by the reference value generation circuit 42 and a value (a voltage value corresponding to the drain current) detected by the bias detection circuit 30 to the bias output buffer circuit 50 (to be specific, a gate of a transistor 51 described later).

The bias output buffer circuit 50 is a buffer circuit that outputs a bias to the transistor 10 (to be specific, the gate of the transistor 10), and includes the transistor 51, transistors 52, 53, and 54, a node N1 and the node N2, and a current source A1.

The transistor 51 is an example of a first p-type transistor. For example, the transistor 51 is a P-channel type FET. The transistor 51 is connected between the comparator 41 and the node N1. Specifically, the gate of the transistor 51 is connected to the output terminal of the comparator 41, the drain of the transistor 51 is connected to the node N1 via the transistor 52, and the source of the transistor 51 is connected to the power supply.

The node N1 is an example of a first node. The node N1 is a node on a path connecting the transistor 51 (to be specific, the drain of the transistor 51) and the bias detection circuit 60. The node N1 is connected between the transistor 51 and the node N2 and between the transistor 51 and the bias detection circuit 60. Specifically, the node N1 is connected to the transistor 51 via the transistor 52, connected to the bias detection circuit 60 via the transistor 53, and connected to the node N2 via the transistor 54.

The node N2 is an example of a second node. The node N2 is a node on a path connecting the bias detection circuit 60 and the gate of the transistor 10. The node N2 is connected between the node N1 and the gate of the transistor 10. Specifically, the node N2 is connected to the node N1 via the transistor 54 and connected to the gate of the transistor 10 via the inductor L1.

The transistor 52 is an example of a second p-type transistor. For example, the transistor 52 is a P-channel type FET. The gate of the transistor 52 is connected to a terminal t3, the drain of the transistor 52 is connected to the node N1, and the source of the transistor 52 is connected to the drain of the transistor 51.

The transistor 53 is an example of a first n-type transistor. For example, the transistor 53 is an N-channel type FET. The gate of the transistor 53 is connected to the terminal t3, the drain of the transistor 53 is connected to the node N1, and the source of the transistor 53 is connected to the bias detection circuit 60 (to be specific, a transistor 61 described later). A voltage for determining the operating points of the transistors 52 and 53 is inputted to the terminal t3.

The transistor 54 is an example of a third n-type transistor. For example, the transistor 54 is the N-channel type FET. The transistor 54 is connected in parallel with the bias detection circuit 60 between the node N1 and the node N2. Specifically, the gate of the transistor 54 is connected to the bias detection circuit 60 via the node N1 and the transistor 53, and the source of the transistor 54 is connected to the bias detection circuit 60 via the node N2. In addition, the drain of the transistor 54 is connected to the power supply.

The current source A1 is connected between the node N2 and the earth terminal. The current source A1 allows a stable current to flow, and as a result, the voltage at the node N2 can be stabilized, and the operation of the bias detection circuit 60 (to be specific, the transistor 61 described later) can be stabilized.

The bias detection circuit 60 is an example of a second bias detection circuit. The bias detection circuit 60 detects the gate voltage of the transistor 10. The bias detection circuit 60 includes the transistor 61. The transistor 61 is an example of a second n-type transistor. For example, the transistor 61 is the N-channel type FET. The bias detection circuit 60 (transistor 61) is connected between the node N1 and the node N2. Specifically, the gate of the transistor 61 is connected to the node N2, the drain of the transistor 61 is connected to the node N1 via the transistor 53, and the source of the transistor 61 is connected to the earth terminal.

Note that the transistors 10, 51, 52, 53, 54, and 61 included in the power amplifier 1 may be bipolar transistors. In this case, the gate in the above description and the following description may be replaced with a base, the drain may be replaced with a collector, and the source may be replaced with an emitter.

Next, the operation of the power amplifier 1 will be described with reference to FIG. 2.

Figure 2:
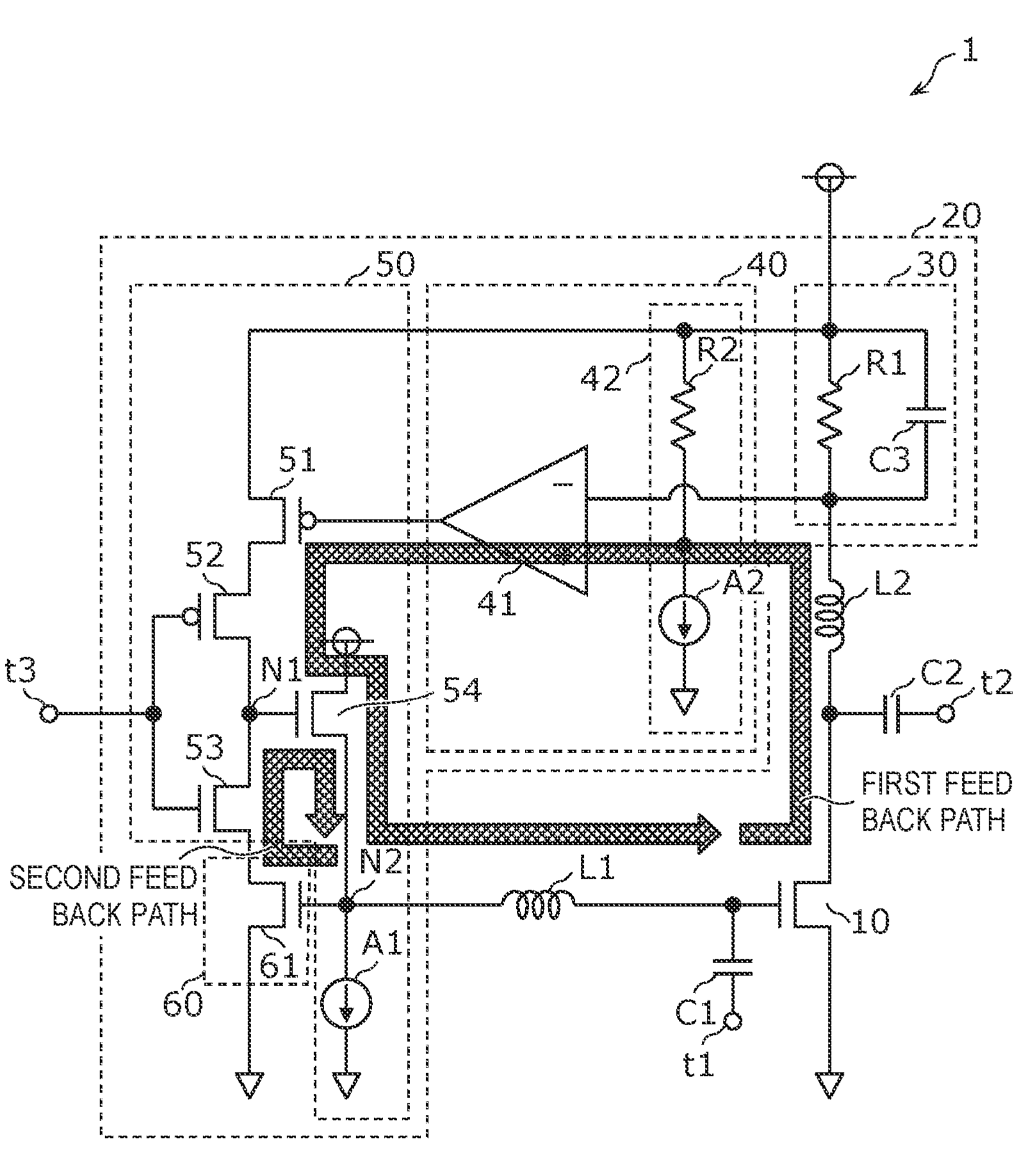
FIG. 2 is a diagram for explaining the operation of the power amplifier according to Embodiment 1.

FIG. 2 is a diagram for explaining the operation of the power amplifier 1 according to Embodiment 1.

The power amplifier 1 is configured by combining a feedback circuit by the bias detection circuit 30, the error amplifier circuit 40, and the transistor 51 and a feedback circuit by the bias detection circuit 60. As illustrated in FIG. 2, the feedback circuit by the bias detection circuit 30, the error amplifier circuit 40, and the transistor 51 constitutes a first feedback path. The first feedback path is provided with the error amplifier circuit 40 and the transistor 51 having a large gain, so that the loop gain is large, but the loop band is narrow instead. Therefore, the feedback circuit by the bias detection circuit 30, the error amplifier circuit 40, and the transistor 51 is a high-precision low-speed feedback circuit having a narrow loop band but a large loop gain. The feedback circuit by the bias detection circuit 60 constitutes a second feedback path as illustrated in FIG. 2. Only the transistor 61 is provided on the second feedback path, so that the loop gain is small, but the loop band is wide instead. Note that the transistor 54 has the source for the output to the gate of the transistor 10 and does not have an amplifying function. Therefore, the feedback circuit by the bias detection circuit 60 is a high-speed feedback circuit having a small loop gain and low precision, but having a wide loop band.

For example, the gate voltage of the transistor 10 may fluctuate due to disturbance, temperature change, or the like, and the low-speed feedback circuit constituting the first feedback path and the high-speed feedback circuit constituting the second feedback path operate so as to suppress the fluctuation.

For example, when the gate voltage of the transistor 10 fluctuates and increases, the low-speed feedback circuit suppresses the fluctuation by the following operation. The drain current of the transistor 10 increases in response to the increase in the gate voltage of the transistor 10. The voltage drop in the resistor R1 increases by the amount of the increase in the drain current, and the voltage applied to the negative-side input terminal of the comparator 41 decreases. Therefore, the voltage outputted from the comparator 41 increases, the current flowing through the transistor 51 and the transistor 52 decreases, and the voltage at the node N1 decreases. As a result, the current flowing through the transistor 54 decreases, and the voltage at the node N2, that is, the gate voltage of the transistor 10 decreases. In addition, when the gate voltage of the transistor 10 fluctuates and increases, the high-speed feedback circuit suppresses the fluctuation by the following operation. In response to the increase in the gate voltage of the transistor 10, the drain current of the transistor 61 increases, and the voltage of the node N1 decreases. As a result, the current flowing through the transistor 54 decreases, and the voltage at the node N2, that is, the gate voltage of the transistor 10 decreases. In this way, the low-speed feedback circuit and the high-speed feedback circuit suppress the fluctuation in which the gate voltage of the transistor 10 increases.

Further, for example, when the gate voltage of the transistor 10 fluctuates and decreases, the low-speed feedback circuit suppresses the fluctuation by the following operation. The drain current of the transistor 10 decreases in response to the decrease in the gate voltage of the transistor 10. The voltage drop at the resistor R1 is reduced by the amount of the reduction in the drain current, and the voltage applied to the negative-side input terminal of the comparator 41 increases. Therefore, the voltage outputted from the comparator 41 decreases, the current flowing through the transistor 51 and the transistor 52 increases, and the voltage at the node N1 increases. As a result, the current flowing through the transistor 54 increases, and the voltage at the node N2, that is, the gate voltage of the transistor 10 increases. In addition, when the gate voltage of the transistor 10 fluctuates and decreases, the high-speed feedback circuit suppresses the fluctuation by the following operation. In response to the decrease in the gate voltage of the transistor 10, the drain current of the transistor 61 decreases, and the voltage at the node N1 increases. As a result, the current flowing through the transistor 54 increases, and the voltage at the node N2, that is, the gate voltage of the transistor 10 increases. In this way, the low-speed feedback circuit and the high-speed feedback circuit suppress the fluctuation in which the gate voltage of the transistor 10 decreases.

As described above, the power amplifier 1 is configured by combining a high-precision and low-speed feedback circuit for accurately detecting and controlling the bias state and a low-precision and high-speed feedback circuit for detecting a change from the bias equilibrium point and quickly correcting the fluctuation.

As described above, the power amplifier 1 includes the transistor 10 and the bias circuit 20. The bias circuit 20 includes the bias detection circuit 30, the error amplifier circuit 40, the bias output buffer circuit 50, and the bias detection circuit 60. The transistor 10 has the drain and the gate, the error amplifier circuit 40 has the comparator 41, and the bias output buffer circuit 50 has the transistor 51, the node N1, and the node N2. The bias detection circuit 30 is connected between the drain of the transistor 10 and the comparator 41, the transistor 51 is connected between the comparator 41 and the node N1, the node N1 is connected between the transistor 51 and the node N2 and between the transistor 51 and the bias detection circuit 60, the node N2 is connected between the node N1 and the gate of the transistor 10, and the bias detection circuit 60 is connected between the node N1 and the node N2.

According to this, in the power amplifier 1, the bias circuit 20 is provided with the low-speed feedback circuit by the bias detection circuit 30, the comparator 41 in the error amplifier circuit 40, and the transistor 51 in the bias output buffer circuit 50, and the high-speed feedback circuit by the bias detection circuit 60. The low-speed feedback circuit constitutes the first feedback path passing through the transistor 10, the bias detection circuit 30, the error amplifier circuit 40, and the transistor 51 and the nodes N1 and N2 in the bias output buffer circuit 50, and can detect a current with high precision because of a large loop gain, and can suppress abnormal oscillation of the loop because of a narrow loop band. On the other hand, the high-speed feedback circuit constitutes the second feedback path passing through the bias detection circuit 60 and the nodes N1 and N2 in the bias output buffer circuit 50, and the circuit configuration for detecting the relative fluctuation value is simplified, and the loop band can be widened. The power amplifier 1 is configured by combining such a high-precision low-speed feedback circuit having a narrow loop band but a large loop gain and a high-speed feedback circuit having a small loop gain and a low precision but a wide loop band, and therefore, can compensate for the respective weak points. For example, as illustrated in FIG. 3, the output impedance of the bias circuit 20 can be maintained low even at high frequencies.

Figure 3:
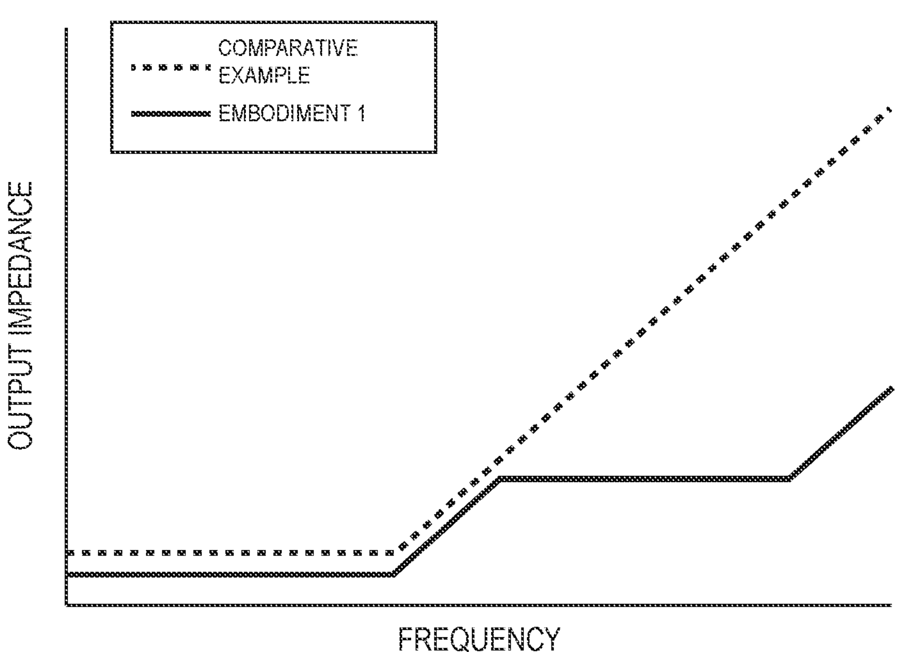
FIG. 3 is a graph illustrating the frequency dependence of the output impedance of a bias circuit in Embodiment 1 and a comparative example.

FIG. 3 is a graph illustrating the frequency dependence of the output impedance of the bias circuit in Embodiment 1 and the comparative example. In the comparative example, the output impedance of the bias circuit provided with the low-speed feedback circuit and not provided with the high-speed feedback circuit is shown, and in Embodiment 1, the output impedance of the bias circuit 20 is shown. In the comparative example, it is found that the output impedance increases with the frequency because the feedback operation is slow. On the other hand, in Embodiment 1, it is understood that the output impedance can be maintained low even at high frequencies by adding the high-speed feedback circuit.

As described above, according to the power amplifier 1 configured by combining the low-speed feedback circuit and the high-speed feedback circuit, it is easy to achieve both the wider band and the higher precision of the bias circuit 20. For example, even when a wideband modulation signal whose envelope amplitude fluctuates at high speed is inputted, the bias circuit 20 can be stably operated, and the performance of the power amplifier 1 can be improved.

For example, the bias output buffer circuit 50 may further include the transistor 52 and the transistor 53, the transistor 51 may be connected to the node N1 via the transistor 52, and the node N1 may be connected to the bias detection circuit 60 via the transistor 53.

The bias detection circuit 60 (for example, the transistor 61) has a large parasitic capacitance, and when the first feedback path formed by the bias detection circuit 30, the error amplifier circuit 40, and the transistor 51 is affected by the bias detection circuit 60, the loop band of the low-speed feedback circuit by the bias detection circuit 30, the error amplifier circuit 40, and the transistor 51 may be further narrowed. Therefore, by providing the transistor 53, it is possible to suppress the influence of the bias detection circuit 60 on the first feedback path, and to suppress the further narrower loop band of the low-speed feedback circuit.

In addition, the transistor 51 has a large parasitic capacitance, and when the second feedback path by the bias detection circuit 60 is affected by the transistor 51, the loop band of the high-speed feedback circuit by the bias detection circuit 60 may be narrowed. Therefore, by providing the transistor 52, the influence of the transistor 51 on the second feedback path can be suppressed, and the loop band of the high-speed feedback circuit can be prevented from being narrowed.

For example, the bias detection circuit 30 may include a resistor element (resistor R1).

According to this, the drain current can be converted into a voltage.

For example, the bias detection circuit 60 may include the transistor 61.

As described above, in the high-speed feedback circuit, the n-type transistor 61 can realize higher-speed feedback than in the case where a p-type transistor is used.

For example, the error amplifier circuit 40 may include the reference value generation circuit 42, and the comparator 41 may output a signal corresponding to the difference between the reference value generated by the reference value generation circuit 42 and the value detected by the bias detection circuit 30 to the transistor 51.

According to this, the stable reference value generated by the reference value generation circuit 42 is used, and thus it is possible to further stabilize the output of the transistor 10.

For example, the bias output buffer circuit 50 may further include the transistor 54, and the transistor 54 may be connected in parallel with the bias detection circuit 60 between the node N1 and the node N2.

According to this, the first feedback path and the second feedback path can be merged at the transistor 54.

For example, the bias output buffer circuit 50 may further include the current source A1, and the current source A1 may be connected between the node N2 and the earth terminal.

This allows the bias detection circuit 60 to operate stably.

For example, the transistor included in the power amplifier 1 may be an FET or a bipolar transistor.

As described above, the transistor included in the power amplifier 1 may be the FET or the bipolar transistor.

Embodiment 2

Embodiment 2 will be described with reference to FIG. 4.

Figure 4:
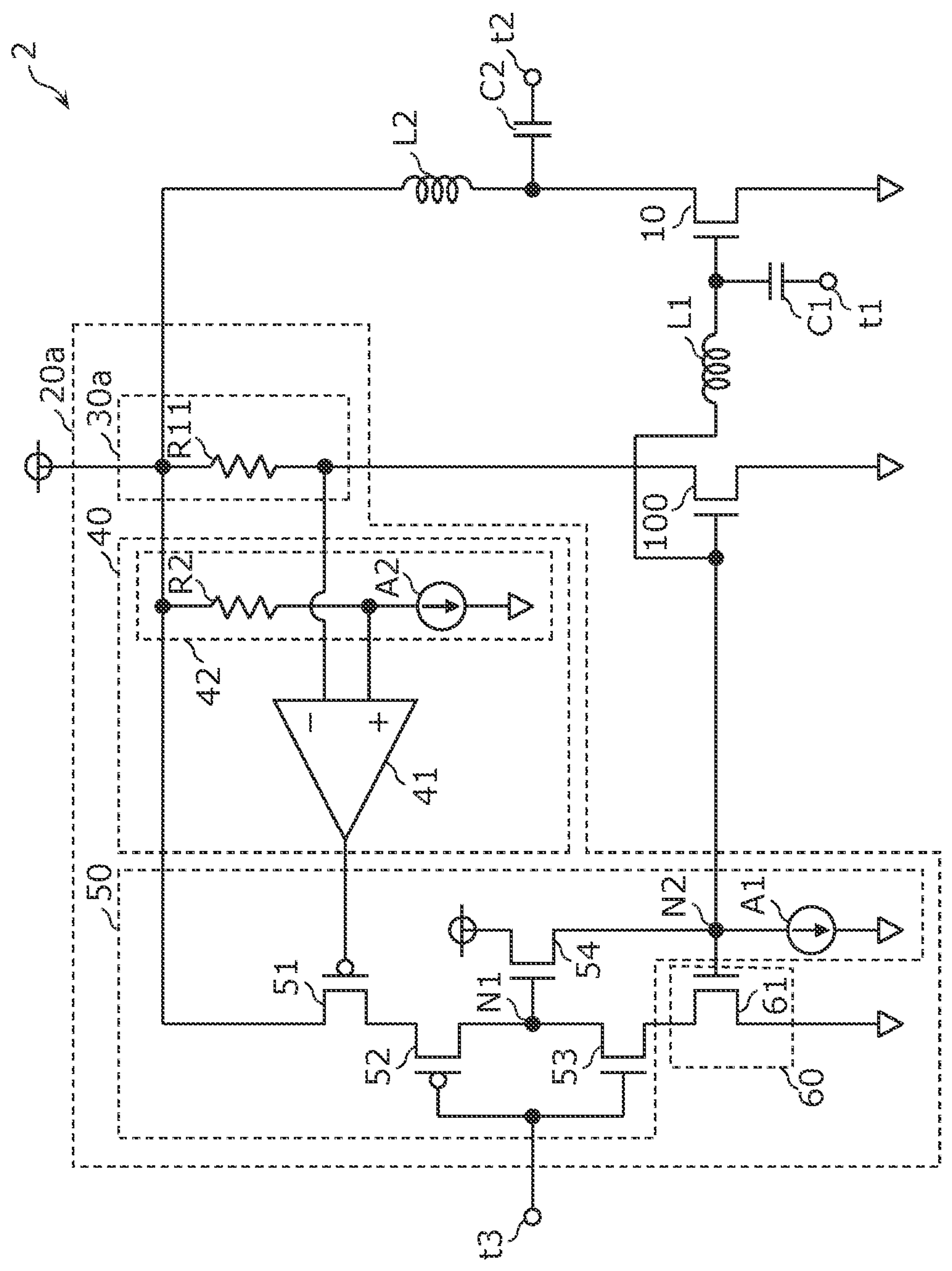
FIG. 4 is a circuit configuration diagram illustrating an example of a power amplifier according to Embodiment 2.

FIG. 4 is a circuit configuration diagram illustrating an example of a power amplifier 2 according to Embodiment 2.

The power amplifier 2 is a circuit that amplifies and outputs an input high-frequency signal, and is, for example, a PA. The power amplifier 2 is different from the power amplifier 1 according to Embodiment 1 in that the power amplifier 2 includes a bias circuit 20*a* instead of the bias circuit 20 and further includes a transistor 100. Further, the connection relationship between the transistor 10 and other components is different from that of the power amplifier 1 according to Embodiment 1. The following description will be focused on the differences from Embodiment 1.

The gate of the transistor 10 is connected to the input terminal t1 via the capacitor C1, and is connected to the bias circuit 20*a* (to be specific, the node N2) and the gate of the transistor 100 via the inductor L1. The drain of the transistor 10 is connected to the output terminal t2 via the capacitor C2, and is connected to the transistor 100 via the inductor L2 and the bias circuit 20*a* (to be specific, a bias detection circuit 30*a* described later).

The transistor 100 is an example of a second power amplification transistor. The transistor 100 has a second output terminal and a second control terminal. The second control terminal is a gate or a base, and the second output terminal is a drain or a collector. In addition, transistor 100 also has a source or emitter connected to an earth terminal. For example, the transistor 100 is the N-channel type FET, and in this case, the second control terminal is the gate, the second output terminal is the drain, and the source is connected to the earth terminal.

The gate of the transistor 100 is connected to the transistor 10 via the inductor L1 and is also connected to the bias circuit 20*a* (to be specific, the node N2). The drain of the transistor 100 is connected to the bias circuit 20*a* (to be specific, the bias detection circuit 30*a* to be described later).

The bias circuit 20*a* is a circuit that detects the drain current of the transistor 100 and the gate voltages of the transistors 10 and 100 and applies the gate voltages to the transistors 10 and 100 so as to suppress the fluctuations in the gate voltages of the transistors 10 and 100 and the fluctuations in the drain currents of the transistors 10 and 100. The bias circuit 20*a* includes the bias detection circuit 30*a*, the error amplifier circuit 40, the bias output buffer circuit 50, and the bias detection circuit 60.

The bias detection circuit 30*a* is an example of the first bias detection circuit. The bias detection circuit 30*a* detects the drain current of the transistor 100. The bias detection circuit 30*a* is connected between the drain of the transistor 100 and the comparator 41. Specifically, the bias detection circuit 30*a* is connected between the drain of the transistor 100 and the negative-side input terminal of the comparator 41. The bias detection circuit 30*a* includes a resistor R11 which is a resistor element. One end of the resistor R11 is connected to the power supply, and the other end of the resistor R11 is connected to the drain of the transistor 100. In addition, the other end of the resistor R11 is connected to the negative-side input terminal of the comparator 41.

The bias detection circuit 30*a* detects the drain current of the transistor 100. The drain current of the transistor 100 is converted into a voltage at the other end of the resistor R11 by the bias detection circuit 30*a*, and the voltage is applied to the negative-side input terminal of the comparator 41.

The transistor 100 is a replica circuit of the transistor 10, and the parameters of the transistor 100 and the parameters of the resistor R11 are set so that the same drain current as the drain current of the transistor 10 flows when the same gate voltage as the transistor 10 is applied.

Although in Embodiment 1, an example is described in which the drain of the transistor 10 is connected to the power supply via the resistor R1 of the bias detection circuit 30, in Embodiment 2, the drain of the transistor 10 is connected to the power supply without a resistor. This is because the drain current of the transistor 100, which is a replica circuit of the transistor 10, is detected instead of the drain current of the transistor 10 to eliminate a resistor for detecting the drain current of the transistor 10.

The other configuration of the power amplifier 2 is the same as that of the power amplifier 1 according to Embodiment 1, and thus a description thereof will be omitted.

As described above, the power amplifier 2 includes the transistor 10, the transistor 100, and the bias circuit 20*a*. The bias circuit 20*a* includes the bias detection circuit 30*a*, the error amplifier circuit 40, the bias output buffer circuit 50, and the bias detection circuit 60. The transistor 10 has the drain and the gate, the transistor 100 has the drain and the gate, the error amplifier circuit 40 has the comparator 41, and the bias output buffer circuit 50 has the transistor 51, the node N1, and the node N2. The bias detection circuit 30*a* is connected between the drain of the transistor 100 and the comparator 41, the transistor 51 is connected between the comparator 41 and the node N1, the node N1 is connected between the transistor 51 and the node N2 and between the transistor 51 and the bias detection circuit 60, the node N2 is connected between the node N1 and the gate of the transistor 100, the bias detection circuit 60 is connected between the node N1 and the node N2, the gate of the transistor 100 is connected to the gate of the transistor 10, and the drain of the transistor 10 is connected to the drain of the transistor 100 via the bias detection circuit 30*a*.

According to this, as in Embodiment 1, it is easy to achieve both the wider band and the higher precision of the bias circuit 20*a*. Further, the power amplifier 2 is provided with the transistor 100 which is a replica circuit of the transistor 10, and the output current (drain current) of the transistor 100 is detected by the bias detection circuit 30*a*. Since the transistor 10 is not affected by the voltage drop caused by the bias detection circuit 30*a*, it is possible to lower the lower limit of the power supply voltage at which the power amplifier 2 can be operated, thereby allowing the use of the power supply having a low output voltage.

OTHER EMBODIMENTS

Although the power amplifiers 1 and 2 according to the present disclosure have been described above with reference to the embodiments, the present disclosure is not limited to the above-described embodiments. The present disclosure includes other embodiments realized by combining arbitrary constituent elements in the above-described embodiments, modifications obtained by applying various modifications conceived by those skilled in the art to the above-described embodiments without departing from the spirit of the present disclosure, and various devices incorporating the power amplifiers 1 and 2 according to the present disclosure.

For example, in the above embodiments, an example in which the bias output buffer circuit 50 includes the transistors 52 and 53 has been described, but the bias output buffer circuit 50 need not include the transistors 52 and 53. In this case, the transistor 51 and the bias detection circuit 60 may be connected to each other without any other element such as a transistor.

For example, in the above embodiments, an example in which the bias detection circuit 60 includes the transistor 61 has been described, but the bias detection circuit 60 need not include the transistor 61. For example, the bias detection circuit 60 may be configured by an element other than a transistor as long as the element has a function of detecting the gate voltage of the transistor 10 or the like.

For example, in the above-described embodiments, an example in which the reference value generation circuit 42 includes the current source A2 has been described, but the reference value generation circuit 42 need not include the current source A2. For example, the reference value generation circuit 42 may include a resistor or the like instead of the current source A2.

For example, in the above embodiments, an example in which the bias output buffer circuit 50 includes the transistor 54 has been described, but the bias output buffer circuit 50 need not include the transistor 54. In this case, the node N1 and the node N2 may be the same node.

For example, in the above embodiments, an example in which the bias output buffer circuit 50 includes the current source A1 has been described, but the bias output buffer circuit 50 need not include the current source A1. For example, the bias output buffer circuit 50 may include a resistor or the like instead of the current source A1.

The present disclosure can be widely used in telecommunication equipment of cellular phones and the like as a power amplifier for amplifying a high-frequency signal.

1, 2 POWER AMPLIFIER
10, 51, 52, 53, 54, 61, 100 TRANSISTOR
20, 20*a* BIAS CIRCUIT
30, 30*a*, 60 BIAS DETECTION CIRCUIT
40 ERROR AMPLIFIER CIRCUIT
41 COMPARATOR
42 REFERENCE VALUE GENERATION CIRCUIT

50 BIAS OUTPUT BUFFER CIRCUIT
A1, A2 CURRENT SOURCE
C1, C2, C3 CAPACITOR
L1, L2 INDUCTOR
N1, N2 NODE
R1, R2, R11 RESISTOR
t1 INPUT TERMINAL
t2 OUTPUT TERMINAL
t3 TERMINAL

The invention claimed is:

1. A power amplifier comprising:
a first power amplification transistor; and
a bias circuit,
wherein the bias circuit comprises a first bias detection circuit, an error amplifier circuit, a bias output buffer circuit, and a second bias detection circuit,
wherein the first power amplification transistor has a first output terminal and a first control terminal,
wherein the error amplifier circuit comprises a comparator,
wherein the bias output buffer circuit comprises a first p-type transistor, a first node, and a second node,
wherein the first bias detection circuit is connected between the first output terminal and the comparator,
wherein the first p-type transistor is connected between the comparator and the first node,
wherein the first node is connected between the first p-type transistor and the second node, and between the first p-type transistor and the second bias detection circuit,
wherein the second node is connected between the first node and the first control terminal, and
wherein the second bias detection circuit is connected between the first node and the second node.

2. The power amplifier according to claim 1,
wherein the bias output buffer circuit further comprises a second p-type transistor and a first n-type transistor,
wherein the first p-type transistor is connected to the first node via the second p-type transistor, and
wherein the first node is connected to the second bias detection circuit via the first n-type transistor.

3. The power amplifier according to claim 1, wherein the first bias detection circuit comprises a resistor element.

4. The power amplifier according to claim 1, wherein the second bias detection circuit comprises a second n-type transistor.

5. The power amplifier according to claim 1,
wherein the error amplifier circuit comprises a reference value generation circuit, and
wherein the comparator is configured to output, to the first p-type transistor, a signal corresponding to a difference between a reference value generated by the reference value generation circuit and a value detected by the first bias detection circuit.

6. The power amplifier according to claim 1,
wherein the bias output buffer circuit further comprises a third n-type transistor, and
wherein the third n-type transistor is connected in parallel with the second bias detection circuit between the first node and the second node.

7. The power amplifier according to claim 1,
wherein the bias output buffer circuit further comprises a current source, and
wherein the current source is connected between the second node and an earth terminal.

8. The power amplifier according to claim 1, wherein at least one of the transistors of the power amplifier is a field effect transistor or a bipolar transistor.

9. A power amplifier comprising:
a first power amplification transistor;
a second power amplification transistor; and
a bias circuit,
wherein the bias circuit comprises a first bias detection circuit, an error amplifier circuit, a bias output buffer circuit, and a second bias detection circuit,
wherein the first power amplification transistor has a first output terminal and a first control terminal,
wherein the second power amplification transistor has a second output terminal and a second control terminal,
wherein the error amplifier circuit comprises a comparator,
wherein the bias output buffer circuit comprises a first p-type transistor, a first node, and a second node,
wherein the first bias detection circuit is connected between the second output terminal and the comparator,
wherein the first p-type transistor is connected between the comparator and the first node,
wherein the first node is connected between the first p-type transistor and the second node and between the first p-type transistor and the second bias detection circuit,
wherein the second node is connected between the first node and the second control terminal,
wherein the second bias detection circuit is connected between the first node and the second node,
wherein the second control terminal is connected to the first control terminal, and
wherein the first output terminal is connected to the second output terminal via the first bias detection circuit.

10. The power amplifier according to claim 9,
wherein the bias output buffer circuit further comprises a second p-type transistor and a first n-type transistor,
wherein the first p-type transistor is connected to the first node via the second p-type transistor, and
wherein the first node is connected to the second bias detection circuit via the first n-type transistor.

11. The power amplifier according to claim 9, wherein the first bias detection circuit comprises a resistor element.

12. The power amplifier according to claim 9, wherein the second bias detection circuit comprises a second n-type transistor.

13. The power amplifier according to claim 9,
wherein the error amplifier circuit comprises a reference value generation circuit, and
wherein the comparator is configured to output, to the first p-type transistor, a signal corresponding to a difference between a reference value generated by the reference value generation circuit and a value detected by the first bias detection circuit.

14. The power amplifier according to claim 9,
wherein the bias output buffer circuit further comprises a third n-type transistor, and
wherein the third n-type transistor is connected in parallel with the second bias detection circuit between the first node and the second node.

15. The power amplifier according to claim 9,
wherein the bias output buffer circuit further comprises a current source, and
wherein the current source is connected between the second node and an earth terminal.

16. The power amplifier according to claim 9, wherein at least one of the transistors of the power amplifier is a field effect transistor or a bipolar transistor.

* * * * *